(12) United States Patent
Schmidt

(10) Patent No.: US 9,178,013 B2
(45) Date of Patent: Nov. 3, 2015

(54) SEMICONDUCTOR DEVICE WITH EDGE TERMINATION AND METHOD FOR MANUFACTURING A SEMICONDUCTOR DEVICE

(75) Inventor: Gerhard Schmidt, Wernberg (AT)

(73) Assignee: Infineon Technologies Austria AG, Villach (AT)

(*) Notice: Subject to any disclaimer, the term of this patent is extended or adjusted under 35 U.S.C. 154(b) by 197 days.

(21) Appl. No.: 13/366,707

(22) Filed: Feb. 6, 2012

(65) Prior Publication Data

US 2013/0200392 A1 Aug. 8, 2013

(51) Int. Cl.
| | |
|---|---|
| H01L 21/336 | (2006.01) |
| H01L 29/06 | (2006.01) |
| H01L 21/326 | (2006.01) |
| H01L 21/36 | (2006.01) |
| H01L 21/20 | (2006.01) |
| H01L 21/479 | (2006.01) |
| H01L 29/66 | (2006.01) |
| H01L 29/16 | (2006.01) |

(52) U.S. Cl.
CPC ............ *H01L 29/0615* (2013.01); *H01L 21/20* (2013.01); *H01L 21/326* (2013.01); *H01L 21/36* (2013.01); *H01L 21/479* (2013.01); *H01L 29/1608* (2013.01); *H01L 29/66068* (2013.01)

(58) Field of Classification Search
CPC ....................................................... H01L 29/16
USPC .......... 257/190, 330, 341, 342; 438/168, 192, 438/478
See application file for complete search history.

(56) References Cited

U.S. PATENT DOCUMENTS

| | | |
|---|---|---|
| 6,242,784 B1 | 6/2001 | Zeng et al. |
| 6,635,944 B2 | 10/2003 | Stoisiek |
| 8,492,771 B2* | 7/2013 | Rub et al. ................. 257/77 |
| 2001/0050369 A1* | 12/2001 | Zeng et al. ............... 257/77 |
| 2003/0127693 A1* | 7/2003 | Zeng et al. ............... 257/367 |
| 2006/0258081 A1* | 11/2006 | Kocon et al. ............. 438/237 |
| 2008/0179671 A1* | 7/2008 | Saito et al. ............... 257/341 |
| 2008/0211020 A1* | 9/2008 | Saito ........................ 257/342 |
| 2009/0008723 A1* | 1/2009 | Schmidt .................... 257/409 |
| 2009/0242977 A1* | 10/2009 | Kawaguchi et al. ...... 257/330 |
| 2011/0049568 A1* | 3/2011 | Lochtefeld et al. ....... 257/190 |
| 2012/0056200 A1* | 3/2012 | Frisina et al. ............. 257/77 |

FOREIGN PATENT DOCUMENTS

| | | |
|---|---|---|
| DE | 102007030755 B3 | 2/2009 |
| WO | 0038242 A1 | 6/2000 |

* cited by examiner

*Primary Examiner* — Ha Tran T Nguyen
*Assistant Examiner* — Ismail Muse
(74) *Attorney, Agent, or Firm* — Murphy, Bilak & Homiller, PLLC

(57) ABSTRACT

According to an embodiment, a semiconductor device includes a semiconductor body having a first semiconductor material and a second semiconductor material having a band gap larger than a band gap of the first semiconductor material. A first pn-junction is formed in the first semiconductor material. A second pn-junction is formed by the second semiconductor material and extends deeper into the semiconductor body than the first pn-junction. The second semiconductor material is in contact with the first semiconductor material and forms part of an edge termination zone of the semiconductor device.

21 Claims, 10 Drawing Sheets

SEMICONDUCTOR DEVICE WITH EDGE TERMINATION AND METHOD FOR MANUFACTURING A SEMICONDUCTOR DEVICE

TECHNICAL FIELD

Embodiments described herein relate to semiconductor devices with an edge termination zone having a vertical pn-junction formed by a high band-gap material and methods for manufacturing such semiconductor devices.

BACKGROUND

High-voltage devices need a reliable edge termination at the edge of the die to ensure that the devices can reliably block the high voltage. The edge termination shall relieve the electric field strength between the active area and the kerf or sawing edge and shall prevent any excessive field increase at the kerf edge. Typically, the edge terminations are adapted to shape the electrical field such that the potential lines are diverted towards the surface of the device without any strong bending or crowding of the potential lines in order to prevent avalanche generation in the semiconductor substrate or dielectric breakdown in the passivation layers. Critical topological areas in the edge termination structure are steps and edges where peak field strength of up to several MV/cm might be generated.

Planar edge terminations, which are a common technique to reduce the electric field strength, employs field plates arranged on the top surface of the devices or a varying lateral doping to adapt the electric field strength at the surface of the semiconductor device. The space required for planar edge terminations is high to prevent any local increase of the electrical field strength above the critical value for avalanche breakdown. To keep the potential line curvature sufficiently small, a lateral width of about 200-250 µm is needed for an edge termination zone of a device capable for blocking 600 V. For a 6.5 kV blocking voltage, the required lateral width increases to about 2000 µm.

Another approach uses the so-called mesa edge termination where the electrical field strength relief at least partially occurs within the vertical depth of the device to reduce the required lateral space. Mesa edge termination zones may include trenches or bevelled pn junctions. Raw techniques such as laser processing, lapping, grinding or sand blasting are needed to produce the desired shape of the edge termination zone which techniques are often unsuitable for wafer mass production.

In view of the above, there is a need for improvement.

SUMMARY

According to an embodiment, a semiconductor device is provided which includes a semiconductor body with a first semiconductor material and a second semiconductor material having a band gap larger than a band gap of the first semiconductor material. A first pn-junction or a heterojunction is formed in the first semiconductor material. A second pn-junction is formed by the second semiconductor material and extends deeper into the semiconductor body than the first pn-junction. The second semiconductor material is in contact with the first semiconductor material and forms part of an edge termination zone of the semiconductor device.

According to an embodiment, a semiconductor device is provided which includes a semiconductor body with a first semiconductor material formed in the semiconductor body. The semiconductor body includes at least a first doping region of a first conductivity type and at least a second doping region of a second conductivity type. The first and second doping regions form a horizontal pn-junction in the first semiconductor material which is substantially parallel to a first surface of the semiconductor body. A second semiconductor material is formed in the semiconductor body, has a band gap larger than a band gap of the first semiconductor material, and includes at least a first doping region of the first conductivity type in contact with the first and second doping regions of the first semiconductor material. The first doping region of the second semiconductor material extends deeper into the semiconductor body than the first doping region of the first semiconductor material.

According to an embodiment, a semiconductor device is provided which includes a semiconductor body with a silicon semiconductor material formed in the semiconductor body and includes at least a first doping region of a first conductivity type and at least a second doping region of a second conductivity type in contact with the first doping region. A horizontal pn-junction in the silicon semiconductor material is formed between the first and second doping regions of the silicon semiconductor material. A high band-gap semiconductor material is formed in the semiconductor body and includes a first doping region of the first conductivity type in contact with the first and second doping regions of the silicon semiconductor material, and a second doping region of the second conductivity type in contact with the first doping region of the high band-gap semiconductor material. A substantially vertical pn-junction is formed in the high band-gap semiconductor material by the first and second doping regions of the high band-gap semiconductor material. The vertical pn-junction extends deeper into the semiconductor body than the horizontal pn-junction.

According to an embodiment, a method for manufacturing a semiconductor device is provided which includes providing a semiconductor body having a first semiconductor material; forming a first pn-junction in the first semiconductor material; forming a trench in the semiconductor body which extends from a first surface of the semiconductor body through the first pn-junction into a given depth below the first pn-junction; at least partially fill the trench with a second semiconductor material having a band gap larger than a band gap of the first semiconductor material to form part of an edge termination zone of the semiconductor device; forming a second pn-junction with the second semiconductor material which extends deeper into the semiconductor body than the first pn-junction in the first semiconductor material.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Figure 1:
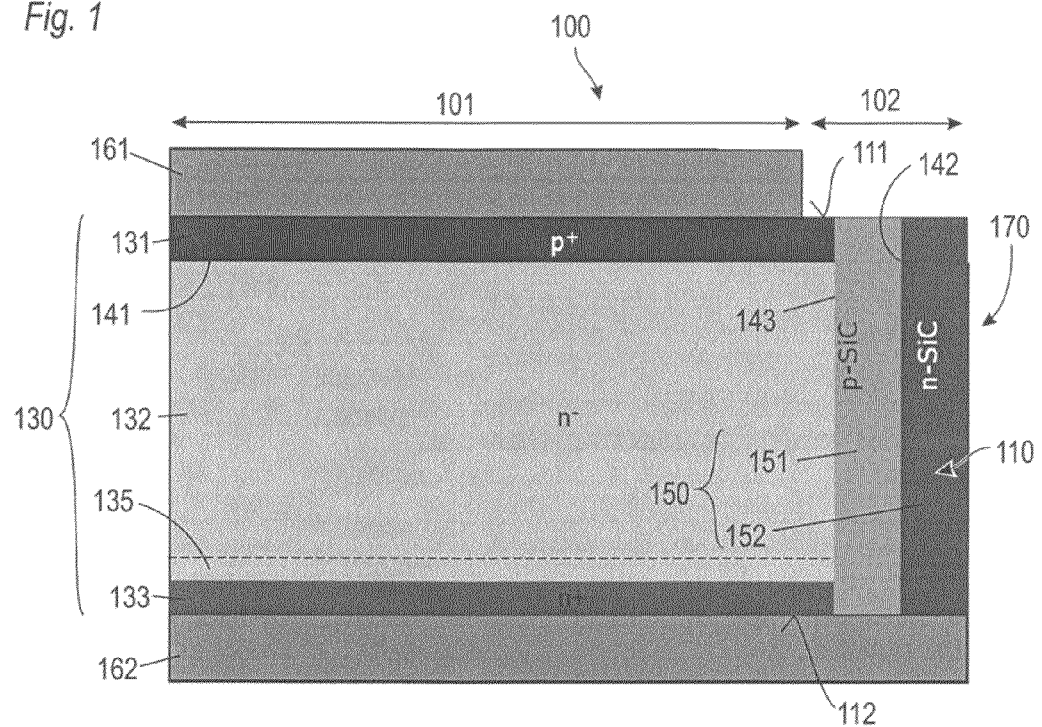
FIG. 1 illustrates a semiconductor device having an edge termination zone with a vertical pn-junction which completely extends through the semiconductor body according to an embodiment.

With reference to FIG. 1, a first embodiment of a semiconductor device 100 is described. The semiconductor device 100 includes a semiconductor body 110 which includes a first semiconductor material 130 and a second semiconductor material 150. The first semiconductor material 130 is a low band-gap material such as Si whereas the second semiconductor material 150 is a high or wide band-gap material such as SiC, GaN or diamond.

The first and second semiconductor materials 130, 150 are not restricted to the above examples and can be made of any semiconductor material suitable for manufacturing semiconductor devices as long as the second semiconductor material 150 has a band-gap which is wider than the band-gap of the first semiconductor material 130.

A first pn-junction 141 is formed in the first semiconductor material 130. The first pn-junction 141 typically extends parallel to a first surface 111 of the semiconductor body 110 and is therefore also referred to as horizontal pn-junction as indicated in FIG. 1.

A second pn-junction 142 is formed by the second semiconductor material 150 and extends deeper into the semiconductor body 110 than the first pn-junction 141. The second semiconductor material 150 is adjacent to and in contact with the first semiconductor material 130 and forms part of an edge termination zone 102 of the semiconductor device 100.

The vertical edge termination zone 102 is mainly formed by the second semiconductor material 150 having a higher band-gap than the first semiconductor material 130. This allows formation of a vertical edge termination zone 102 with reduced lateral extension or width. The electric field strength can be relieved within a comparably short distance owing to the high breakdown field strength of the wide band-gap material such as SiC. For example, SiC has a breakthrough field strength $E_{crit}$>2 MV/cm which is higher than the breakdown field strength of Si by about a factor of 10. The electric field within the second semiconductor material 150 can therefore be much higher.

The vertical second pn-junction 142, which extends deeper into the semiconductor body 110 than the first pn-junction 141, diverts the potential lines toward the first surface 111 and keeps the lateral edge or the kerf edge 170 field-free.

According to an embodiment, the first semiconductor material 130 includes at least a first doping region 131 of a first conductivity type and at least a second doping region 132 of a second conductivity type. First conductivity type is here of p-type and the second conductivity type of n-type. The person skilled in the art will appreciate that the first conductivity type can also be n-type while the second conductivity type can be p-type.

The first and second doping regions 131, 132 form the first or horizontal pn-junction 141 in the first semiconductor material 130. According to an embodiment, the first doping region 131 forms the anode region of a power diode while the second doping region 132 forms the drift region of the diode. According to another embodiment, the first doping region 131 forms the body region of a power-FET or IGBT while the second doping region 132 forms the drift region of the power-FET or IGBT. In the following, reference is made to a power diode. However, the same applies to power-FETs such as SIPMOS-transistors, DMOS-transistors and transistors having a compensation area (so-called COOLMOS), and IGBTs. In these embodiments, the first and second doping regions 131, 132 form the main pn-junction of the respective device. This pn-junction 141 is mainly parallel to the first surface 111, i.e. its runs parallel to the first surface 111, and is arranged in the so-called active area 101. The edge termination zone 102 is arranged laterally adjacent to the active area 101. According to an embodiment, which will be described further below, the edge termination zone 102 laterally completely surrounds the active area 101 and is arranged in the peripheral area of the device 100.

According to an embodiment, the first doping region 131 is in ohmic contact with a first electrode 161 arranged on the first surface 111 of the semiconductor body 110. The first electrode 161 forms, in the present embodiment, the anode electrode of the power diode.

According to an embodiment, the second semiconductor material 150 includes at least a first doping region 151 of the first conductivity type adjacent to and in contact with the first and second doping regions 131, 132 of the first semiconductor material 130. In the present embodiment, the first doping region 151 of the second semiconductor material 150 is a p-doped SiC region having a doping concentration in a range from about $1 \cdot 10^{15}/cm^3$ to about $5 \cdot 10^{16}/cm^3$. The first doping region 151 of the second semiconductor material 150 extends deeper into the semiconductor body 110 than the first doping region 131 of the first semiconductor material 130. The first doping region 151 of the second semiconductor material 150 is of the same conductivity type as the first doping region 131 of the first semiconductor material 130, i.e. both are in electric contact with each other. A pp- or an nn-heterojunction is formed between the first doping region 151 of the second semiconductor material 150 and the first doping region 131 of the first semiconductor material 130. On the other hand, a third pn-junction or heterojunction 143 might be formed between the first doping region 151 of the second semiconductor material 150 and the second doping region 132 of the first semiconductor material 130.

According to an embodiment, the second semiconductor material 150 includes at least a second doping region 152 of the second conductivity type adjacent to and in contact with the first doping region 151 of the second semiconductor material 150. The second pn-junction 142 is formed between the first and second doping regions 151, 152 of the second semiconductor material 150. In the present embodiment, the second doping region 152 of the second semiconductor material 150 is an n-doped SiC region having a doping concentration in a range from about $1 \cdot 10^{16}/cm^3$ to about $1 \cdot 10^{17}/cm^3$.

According to an embodiment, the first doping region 151 of the second semiconductor material 150 is arranged between the second doping region 152 of the second semiconductor material 150 and the first and second doping regions 131, 132 of the first semiconductor material 130.

According to an embodiment, the first doping region 151 of the second semiconductor material 150 extends from the first surface 111 to a second surface 112 of the semiconductor body 110. Furthermore, the second doping region 152 of the second semiconductor material 150 extends from the first surface 111 to the second surface 112. In this embodiment, the second pn-junction 142 completely extends through the semiconductor body 110.

According to an embodiment, a second electrode 162 is arranged on the second surface 112 of the semiconductor body 110 and in ohmic contact with the second doping region 132 of the first semiconductor material 130. A highly doped third doping region 133 of the second conductivity type (in this embodiment n-type) can be formed at the second surface 112 to form a cathode region and to provide a low ohmic contact. Furthermore, a field stop layer 135 (indicated by a dashed line) of the same conductivity type as for the second doping region 132 can be formed between the second and third doping regions 132 and 133 of the first semiconductor material 130 close to the second surface 112. In the case of a power-diode, the second electrode 162 forms the cathode electrode of the diode. In case of power-FETs, the second electrode 162 forms the drain electrode while the third doping region 133 of the first semiconductor material 130 is the drain region of the device.

According to an embodiment, the third doping region 133 of the first semiconductor material 130 is of the first conductivity type (in this embodiment p-type) and in ohmic contact with the second electrode 162. This particularly applies for IGBTs where the third doping region 133 forms an emitter region and the second electrode 162 forms the emitter electrode of the device.

According to an embodiment, the first semiconductor material 130 is comprised of Si and the second semiconductor material 150 is comprised of SiC. In the following, the first semiconductor material 130 is referred to as Si-material while the second semiconductor material 150 is referred to as SiC-material without being limited thereto.

The embodiment illustrated in FIG. 1 is particularly suitable for devices having a pronounced punch through dimensioning, i.e. devices where the electric field is trapezoid-like shaped due to the sharp decrease of the electric field close to the cathode region 133 or a field stop region 135.

A further embodiment of a semiconductor device 200 is described next with reference to FIG. 2. This embodiment is similar to the embodiment of FIG. 1, but has a modified edge termination zone. The semiconductor device 200 includes a semiconductor body 210 having a first surface 211 and a second surface 212 opposite the first surface 211. The semiconductor body includes a Si-material 230 and a SiC-material 250. The Si-material 230 includes a first doping region 231, a second doping region 232 and a third doping region 233 as described above. Third doping region 233 has a higher doping concentration than the second doping region 232 and is of the same conductivity type as the second doping region 232. The first and second doping regions 231, 232 form a first pn-junction 241, which extends parallel to the first surface 211. The first pn-junction 241 is arranged in the active area 201 which is laterally surrounded by an edge termination zone 202.

The edge termination zone 202 includes the SiC-material 250 which, different to FIG. 1, only partially extends into the semiconductor body 210 without reaching the second surface 212. Accordingly, first and second doping regions 251, 252 of the SiC-material 250 extend from the first surface 211 only partially into the semiconductor body 210 up to a given depth. The extension into the depth can correspond, for example, to at least 30% and particularly of at least 50% of the total thickness of the semiconductor body 210. Moreover, the first doping region 251 of the SiC-material 250 completely separates the second doping region 252 of the SiC-material 250 from the first and second doping regions 231, 232 of the Si-material 230. To this end, the first doping region 251 of the SiC-material 250 has a lateral extension 253 which extends below the second doping region 252 towards the kerf edge 270. As in the embodiment of FIG. 1, the second doping region 252 of the SiC-material 250 is arranged on the outer side of the first doping region 251 with respect to the active area 201, i.e. more peripheral than the first doping region 251. For example, the second doping region 252 can be arranged at the kerf or sawing edge 270 or in a trench.

The first and second doping regions 251, 252 of the SiC-material 250 form a second pn-junction 242 which extends deeper into the semiconductor body 210 than the first doping region 231 of the Si-material 230 and the first pn-junction 241. A third pn-junction 243, which is a heterojunction, might be formed between the first doping region 251 of the SiC-material 250 and the second doping region 232 of the Si-material 230. The p-doped Si-region 231 and the p-doped SiC region 251 (first doping regions of the Si- and SiC-material) are in electric contact with each other as described above.

Similar as described above, first and second electrodes 261 and 262 are formed on the first and second surfaces 211, 212 of the semiconductor body 210, respectively.

Figure 2:
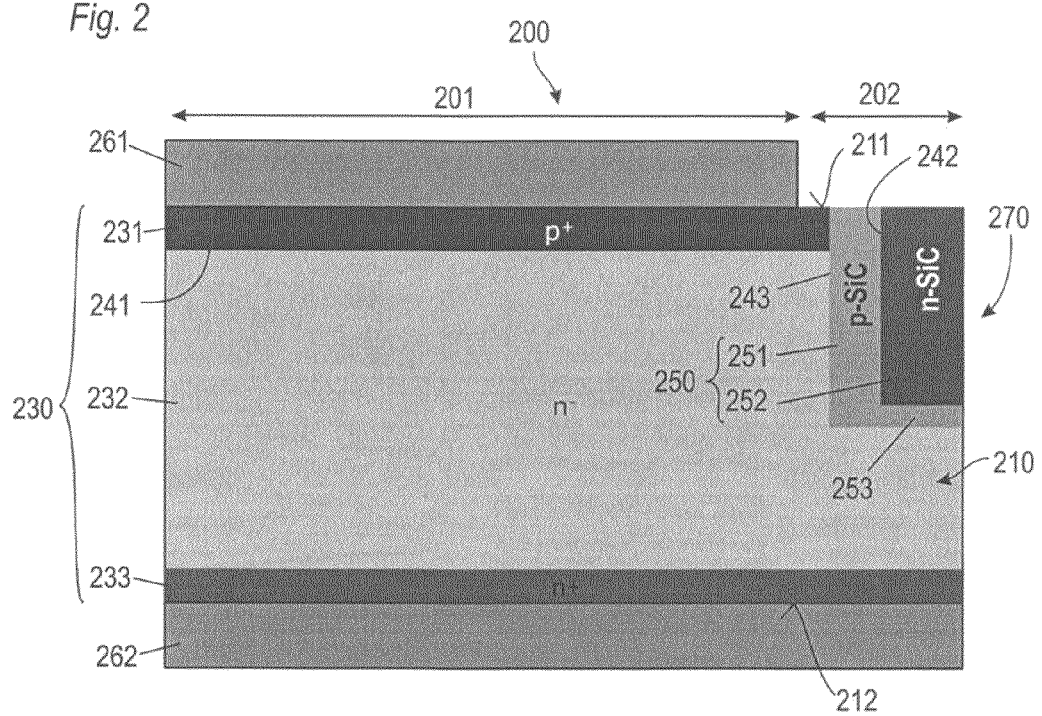
FIG. 2 illustrates a semiconductor device having an edge termination zone with a vertical pn-junction which partially extends through the semiconductor body according to an embodiment.

The embodiment of FIG. 2 is particularly suitable for devices having a non-punch through dimensioning where the electric field, under blocking voltage, has a more triangular shape. The lateral extension of the p-doped SiC region 251 below the n-doped SiC region 252 serves for spreading the electric potential lines diverted to the first surface 211 so that the effective electric field is reduced for the Si-material extending below the SiC-material 250.

A further embodiment of a semiconductor device 300 is described next with reference to FIG. 3. This embodiment is similar to the embodiment of FIG. 2 except that the p-doped SiC region 351 has no lateral extension. The semiconductor device 300 includes a semiconductor body 310 with a first surface 311, a second surface 312, a Si-material 330 and a SiC-material 350 as described above. The Si-material 330 includes a first doping region 331 (p-doped Si-region), a second doping region 332 (n-doped Si-region) and a third doping region 333 (n-doped Si-region) as described above. The third doping region 333 has a higher doping concentration than the second doping region 332. The p-doped Si-region 331 and the n-doping Si-region 332 form a first pn-junction 341, which extends parallel to the first surface 311. The first pn-junction 341 is arranged in the active area 301 which is laterally surrounded by an edge termination zone 302.

The edge termination zone 302 includes the SiC-material 350 which only partially extends into the semiconductor body 310 without reaching the second surface 312. Accordingly, the first and second doping regions 351, 352 (p-doped SiC region and n-doped SiC region) of the SiC-material 350 extend from the first surface 311 only partially into the semiconductor body 310 up to a given depth, for example as described further above. The p-doped SiC region 351 is arranged between the n-doped SiC region 352 and the p-doped Si region 331 and laterally separates the n-doped Si region 332 of the Si-material 330 from the n-doped SiC region 352. As in the embodiment of FIG. 2, the n-doped SiC region 352 of the SiC-material 350 is arranged on the outer side of the p-doped SiC region 351 with respect to the active area 301, i.e. more peripheral than the first doping region 351. For example, the second doping region 352 can be arranged at the kerf or sawing edge 370 or in a trench.

The p-doped SiC region 351 and the n-doped SiC region 352 form a second pn-junction 342 which extends deeper into the semiconductor body 310 than the p-doped Si region 331 and the first pn-junction 341. A third pn-junction or heterojunction 343 might be formed between the p-doped SiC region 351 and the second n-doped Si region 332. The p-doped Si-region 331 and the p-doped SiC region 351 are adjacent to and in contact with each other as described above.

Similar as described above, first and second electrodes 361 and 362 are formed on the first and second surfaces 311, 312 of the semiconductor body 310.

Figure 3:
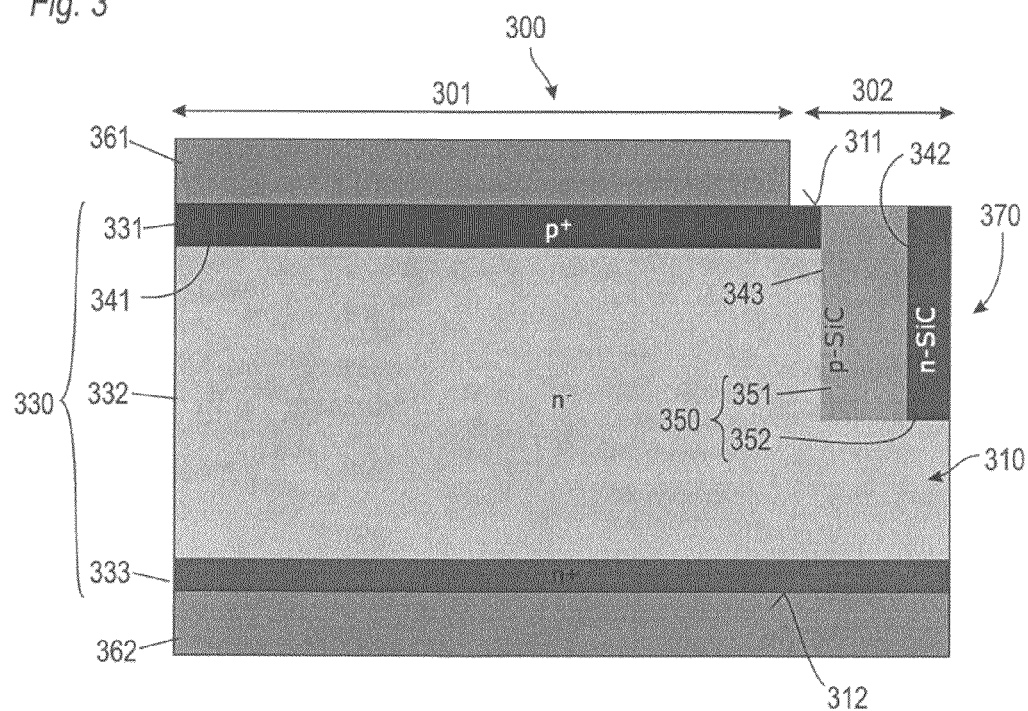
FIG. 3 illustrates a semiconductor device having an edge termination zone with a vertical pn-junction which partially extends through the semiconductor body according to another embodiment.

The embodiment of FIG. 3 is particularly suitable for devices having a non-punch through dimensioning where the electric field, under blocking voltage, has a more triangular shape.

Figure 4:
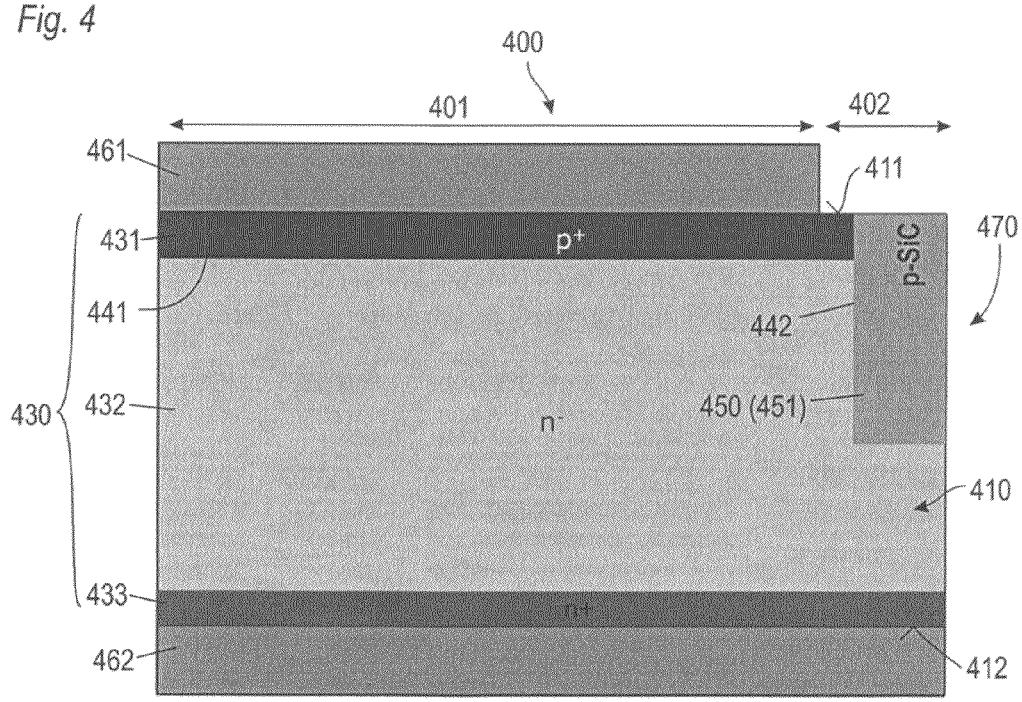
FIG. 4 illustrates a semiconductor device having an edge termination zone with a vertical pn-heterojunction which partially extends through the semiconductor body according to a further embodiment.

A further embodiment of a semiconductor device 400 is described next with reference to FIG. 4. This embodiment is similar to the embodiment of FIG. 3 except that no n-doped SiC region is formed. The semiconductor device 400 includes a semiconductor body 410 with a first surface 411, a second surface 412, a Si-material 430 and a SiC-material 450 as described above. The Si-material 430 includes a first doping region 431 (p-doped Si-region), a second doping region 432 (weakly n-doped Si-region) and a third doping region 433 (n-doped Si-region) as described above. The n-doped Si-region (third doping region) 433 has a higher doping concentration than the n-doped Si-region (second doping region) 432.

The p-doped Si-region 431 and the n-doping Si-region 432 form a first pn-junction 441, which extends parallel to the first surface 411. The first pn-junction 441 is arranged in the active area 401 which is laterally surrounded by an edge termination zone 402.

The edge termination zone 402 includes the SiC-material 450 which only partially extends into the semiconductor body 410 without reaching the second surface 412. Accordingly, the first doping region 451 (p-doped SiC region) of the SiC-material 450 extends from the first surface 411 only partially into the semiconductor body 410 up to a given depth, for example as described above. The p-doped SiC region 451 can be arranged at the kerf or sawing edge 470 or in a trench.

The p-doped SiC region 451 and the n-doped Si region 432 form in this embodiment a second pn-junction or heterojunction 442 which extends deeper into the semiconductor body 410 than the p-doped Si region 431 and the first pn-junction 441. The p-doped Si-region 431 and the p-doped SiC region 451 are adjacent to and in contact with each other as described above.

Similar as described above, first and second electrodes 461 and 462 are formed on the first and second surfaces 411, 412 of the semiconductor body 410.

Figure 5:
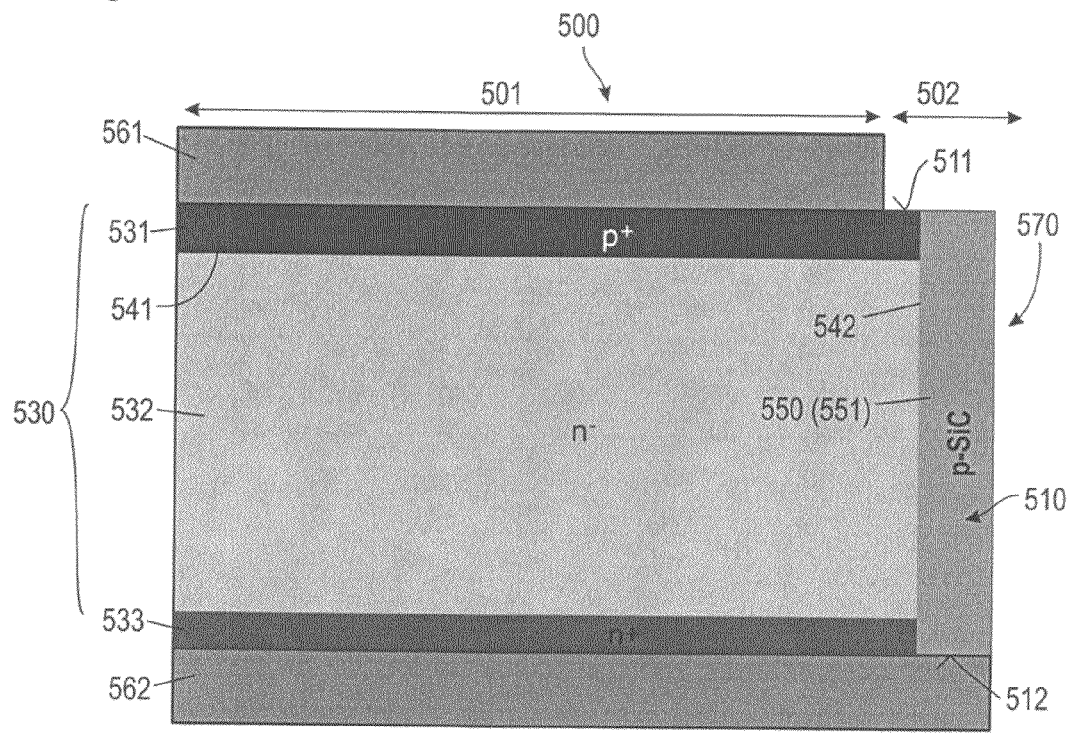
FIG. 5 illustrates a semiconductor device having an edge termination zone with a vertical pn-heterojunction which completely extends through the semiconductor body according to another embodiment.

A further embodiment of a semiconductor device 500 is described next with reference to FIG. 5. This embodiment is similar to the embodiment of FIG. 1 except that no n-doped SiC region is formed. The semiconductor device 500 includes a semiconductor body 510 with a first surface 511, a second surface 512, a Si-material 530 and a SiC-material 550 as described above. The Si-material 530 includes a first doping region 531 (p-doped Si-region), a second doping region 532 (weakly n-doped Si-region) and a third doping region 533 (n-doped Si-region) as described above. The n-doped Si-region (third doping region) 533 has a higher doping concentration than the n-doped Si-region 532 (second doping region).

The p-doped Si-region 531 and n-doping Si-region 532 form a first pn-junction 541, which extends parallel to the first surface 511. The first pn-junction 541 is arranged in the active area 501 which is laterally surrounded by an edge termination zone 502.

The edge termination zone 502 includes the SiC-material 550 which completely extends through the semiconductor body 510 up to the second surface 512. Accordingly, the first doping region 551 (p-doped SiC region) of the SiC-material 550 extends from the first surface 511 through the semiconductor body 510 up to the second surface 512. The p-doped SiC region 551 can be arranged at the kerf or sawing edge 570 or in a trench.

The p-doped SiC region 551 and the n-doped Si region 532 form in this embodiment a second pn-junction or heterojunction 542 which extends deeper into the semiconductor body 510 than the first p-doped Si region 531 and the first pn-junction 541. The p-doped Si-region 531 and the p-doped SiC region 551 are in electric contact with each other as described above.

Similar as described above, first and second electrodes 561 and 562 are formed on the first and second surfaces 511, 512 of the semiconductor body 510.

The second electrode 562 can also be laterally spaced from the kerf edge 570 so that the second electrode 570 is not in contact with the first doping region 551 of the SiC-material 550. This can also be the case for the embodiment of FIG. 1 or in any of the other embodiments. Furthermore, the location of the lateral edge of the second electrode 562 can correspond to the location of the lateral edge of the first electrode 561 which is spaced apart from the kerf edge 570.

Figure 6A:
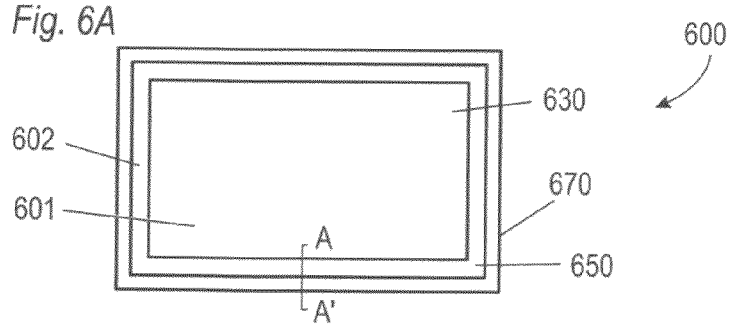
FIGS. 6A to 6C illustrate a semiconductor device having an edge termination zone formed in a trench.

A further embodiment of a semiconductor device 600 is described next with reference to FIGS. 6A to 6C. This embodiment can be combined with any of the above embodiments. The semiconductor device 600 includes a semiconductor body 610 with an active area 601 and an edge termination zone 602 laterally surrounding the active area 601. FIG. 6A is a plan view onto the device 600. The edge termination zone 602 is arranged between the active area 601 and the kerf edge 670. As described above, a first semiconductor material (low band-gap material) 630 such as Si is arranged in the active area 601 while a second semiconductor material (wide band-gap material) 650 is arranged in the edge termination zone 602. Hence, the second semiconductor material 650 laterally surrounds the first semiconductor material 630 at least on the first surface 611 of the semiconductor body 610 to form the edge termination zone 602 of the semiconductor device 600.

Figure 6B:
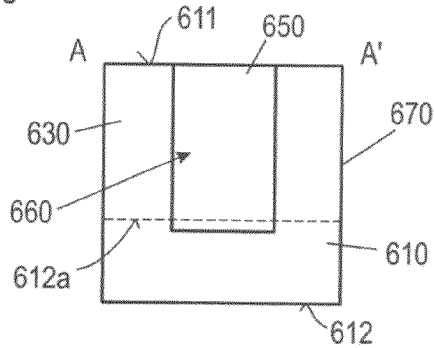

FIG. 6B illustrates a cross-sectional view along line AA' in FIG. 6A. The second semiconductor material (SiC-material) 650 is arranged in a trench 660 formed in the semiconductor body 610 and extends from the first surface 611 of the semiconductor body 610 up to a given depth. The trench 660 is formed close to the sawing or kerf edge 670. Trench 660 is completely filled with the wide band-gap material 650. In case of the embodiments illustrated in FIGS. 1 and 5, the second surface 612 of the semiconductor body 610 will be processed, for example grinded or etched, to reduce the total thickness of the semiconductor body 610 until the wide band-gap material 650 is exposed on the processed second surface 612 so that the band-gap material 650 completely extends through the semiconductor body 610. Alternately, the thickness of the semiconductor body 610 can be reduced without exposing the wide band-gap material 650. An edge termination zone 602, which completely extends through the semiconductor body 610, is formed for punch through devices.

Figure 6C:
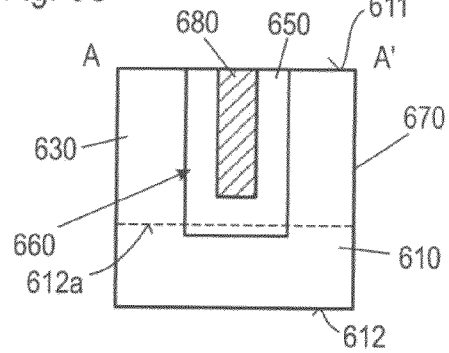

FIGS. 6B and 6C indicates the final thickness of the semiconductor body 610 by dashed line 612a, which will then form the second surface of the semiconductor body 610.

The wide band-gap material 650 can also only partially fill the trench 660 as illustrated in FIG. 6C. The remaining portions of the trench 660 are then filled with a dielectric material 680.

The formation of the edge termination zone 602 in the trench 660 is suitable for mass production on the wafer level and is compatible with present technologies for MOS and IGBT processes. The trench 660 is typically formed close to the final rim or edge of the chip, for example in the sawing or kerf frame of the chip, around the active area. Alternatively the trench 660 can be formed directly in the kerf frame and the final separation of the chips is done by cutting through the middle of the trench region without wasting any additional semiconductor area. A plurality of chips can be processed at the same time on a wafer which will be finally cut along predetermined lines (cut lines or sawing lines) to separate the individual chips. The trench 660 is formed up to a given depth, which can be the final depth of the trench 660, or deeper when the wafer is finally thinned at the second surface 612. The trench 660 is then completely filled either with the wide band-gap material 650 only or as illustrated in FIG. 6C. Finally, the second surface 612 can be processed to thin the semiconductor body 610 to its target thickness.

The trench 660 can be spaced apart from the kerf edge 670 so that the portion of the Si-material 630 between the trench 660 filled with the SiC-material 650 and the kerf edge 670 functions as a field plate. It is, however, also possible that the trench 660 is arranged at the kerf edge 670 and is vertically cut during separation. In this case, either the n-doped SiC region (in case of the embodiments illustrated in FIGS. 1-3) or the p-doped SiC region (in case of the embodiments illustrated in FIGS. 4 and 5) is exposed at the kerf edge 670.

The first and second doping regions (p-doped SiC and n-doped SiC) of the SiC-material are appropriately doped to guide the electric potential lines. The n-doped SiC region typically keeps the electric potential lines away from the kerf edge to prevent that the electric field and the depletion zone of the first pn-junction reaches the kerf edge having many crystal defects which would reduce the blocking capability. Since an n-doped SiC region alone may cause an increase of the electric field in the adjacent Si material, acceptors should be introduced into the sidewalls of the trench. According to several embodiments, this can be done by providing the p-doped SiC region between the n-doped SiC region and the n-doped second doping region of the Si-material. The p-doped SiC region, which can be a layer laterally surrounding the second doping region (drift region) of the Si-material, prevents an increase of the electric field in the drift region. An additionally provided n-doped SiC-region further improves the properties of the edge termination zone and can guide the electric potential lines completely away from the edge to keep the edge substantially field-free.

Hence, by providing a vertical edge termination comprised of a wide band-gap material and forming a vertical pn-junction adjacent to the lateral pn-junction of the device, a reliable edge termination zone which covers only a little space can be formed. The wide band-gap material can be formed, for example, by heteroepitaxial growth of SiC on Si. To provide the vertical edge termination with the desired properties, the doping level and the geometrical dimensioning should be selected such that the electric field is mainly relieved within the SiC material and that the electric field is kept below the critical breakdown threshold in the Si material.

As described above, the wide band-gap material can be arranged in a trench and thus laterally spaced from the kerf edge by a given distance. To save even more semiconductor area, the wide band-gap material is arranged at the kerf edge so that it is laterally exposed. If an additional n-doped SiC region is provided, the electric potential lines can be completely guided within the n-doped SiC region towards the first surface. No additional semiconductor area between the n-doped SiC region and the kerf edge is therefore needed so that the n-doped SiC region appears at the kerf edge. When no additional n-doped SiC region is provided as in FIGS. 4 and 5, the electric potential lines partially passes through the kerf edge. To avoid any malfunction or breakdown of the device, the kerf edge can be polished or processed to remove defects at which a breakdown may occur.

A specific example will now be explained with reference to FIG. 1 which shows a power diode. Assume that the power diode has a rated blocking voltage of 1200 V. The first semiconductor material 130 of the semiconductor body 110 is n-doped Si having a specific resistance of 53 Ωcm. The semiconductor body 110 has a thickness of 125 µm. A highly p-doped anode region (first doping region 131 of the Si-material 130) is formed at the first surface 111 with a junction depth (distance of the first pn-junction 141 from the first surface 111) of about 6 µm. The anode region 131 has a surface doping concentration of about $1 \cdot 10^{17}/cm^3$.

The highly n-doped emitter or cathode region 133 formed at the second surface 112 has a surface doping concentration of about $3.5 \cdot 10^{15}/cm^3$ or more and a depth of about 2 µm. An n-doped field stop region is formed between the emitter region 133 and the drift region 132 and has a peak doping concentration of about $1.3 \cdot 10^{14}/cm^3$. The field stop region extends up to a depth of about 10 µm from the second surface 112.

An about 60 µm wide and about 70 µm deep trench is formed at the first surface 111 of the semiconductor body 110 and filled with an SiC epitaxial layer 150 which includes a p-doped SiC region 151 and a n-doped SiC region 152. The n-doped SiC region 152 forms an n-doped channel stopper while the p-doped SiC region 151 serves to provide acceptors. The p-doped SiC region 151 can have a larger lateral extension (greater thickness) than the n-doped region SiC 152 to ensure sufficient blocking capability of the device. When the diode has a hard punch through dimensioning, at least the p-doped SiC region 151 extends completely through the semiconductor body 110. The doping concentration of the p-doped SiC region 151 and the n-doped SiC region 152 can be substantially constant.

The semiconductor body 110 can be covered by a dielectric material 180.

Common devices (with planar junction terminations) include a highly doped channel stopper region, which would be formed between the trench and the kerf edge 170, may have a surface doping concentration of at least $1 \cdot 10^{18}/cm^3$ and extend to a depth of about 6 µm from the first surface 111. However, such an additional channel stopper which would require an additional lateral space of about 70 µm (because of the lateral spread of the space charge region in the drift zone underneath) is not needed any more when using the approach described herein.

A simulation has revealed that for an assumed blocking voltage of 1400 kV a lateral thickness of the p-doped SiC region 151 of about 40 µm is needed when the doping concentration is about $1 \cdot 10^{15}/cm^3$. The doping concentration of the n-doped SiC region can be varied in a comparably large range but has been set in this example to about $1 \cdot 10^{16}/cm^3$ with a lateral thickness of about 10 µm. Hence, the p-doped SiC region 151 and the n-doped SiC region 152 can be of different thickness. The dielectric constants for Si and SiC, which do not differ significantly, were set equal to simplify the simulation.

Figure 7:
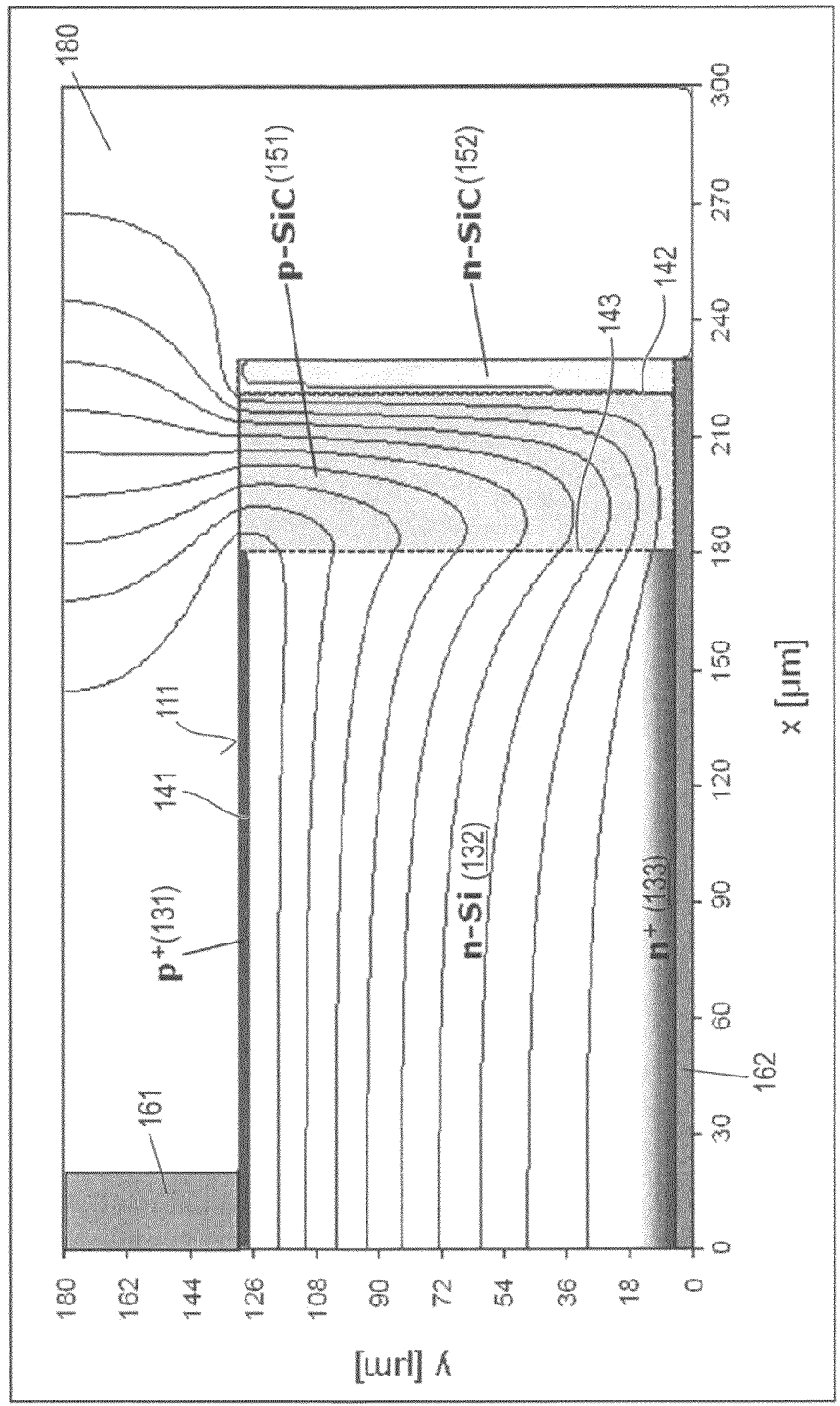
FIG. 7 illustrates a simulation of the distribution of the electric potential lines in an edge termination zone at 1400 V according to an embodiment.
Figure 8:
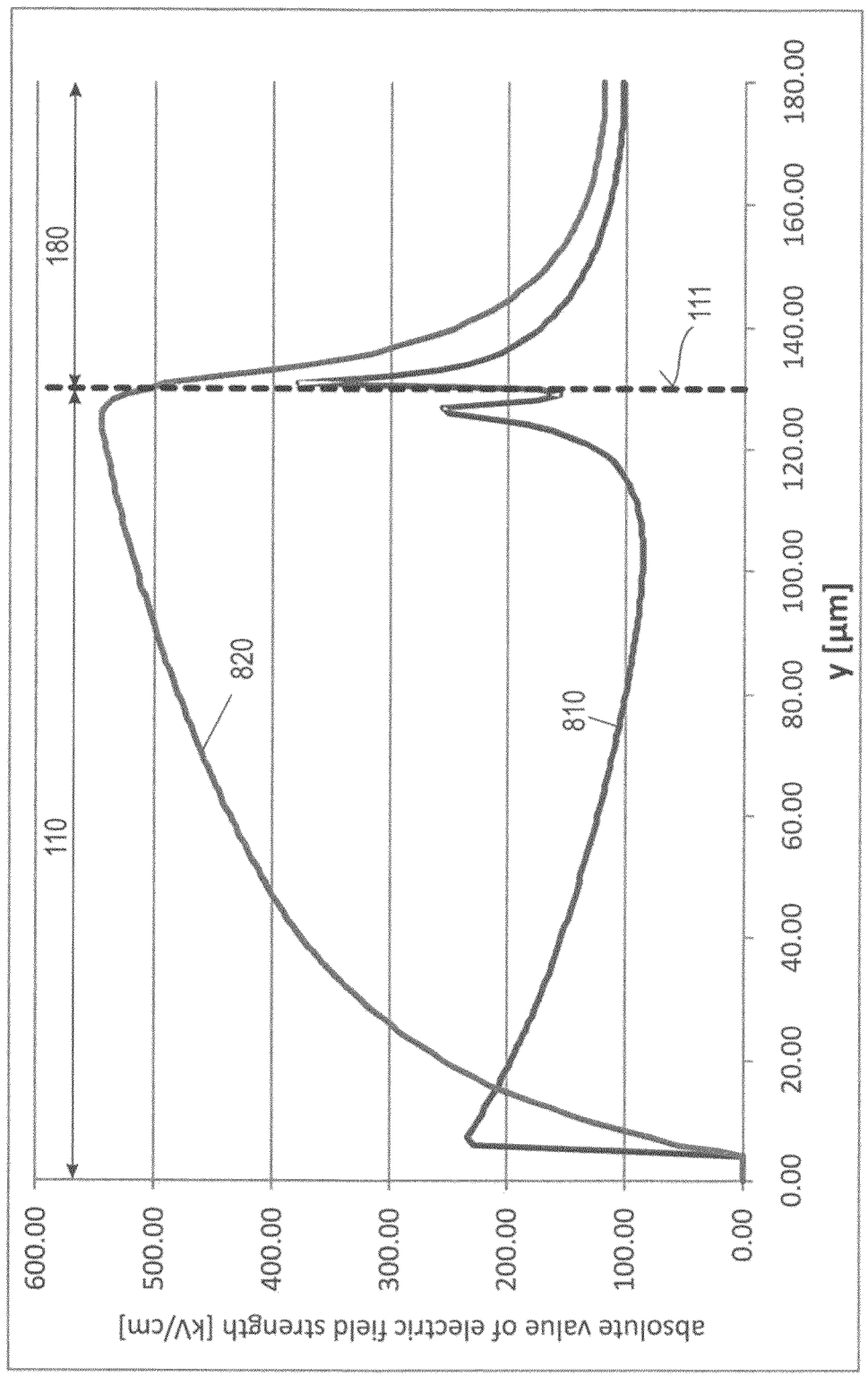
FIG. 8 illustrates the distribution of the electric field strength of the embodiment of FIG. 7.

The resulting distribution of the potential lines is illustrated in FIG. 7. FIG. 8 illustrates the electric field distribution. Line 810 in FIG. 8 indicates the electric field along the vertical Si/p-SiC interface 143, corresponding to an x-value of about 180 µm in FIG. 7, while line 820 in FIG. 8 indicates the electric field along a vertical line, corresponding to an x-value of about 219 µm in FIG. 7, through the p-doped SiC region 150. The electric field within the p-doped SiC region 152 (line 820) is significantly larger than electric field in the drift region 132 of the Si-material 130.

Figure 9:
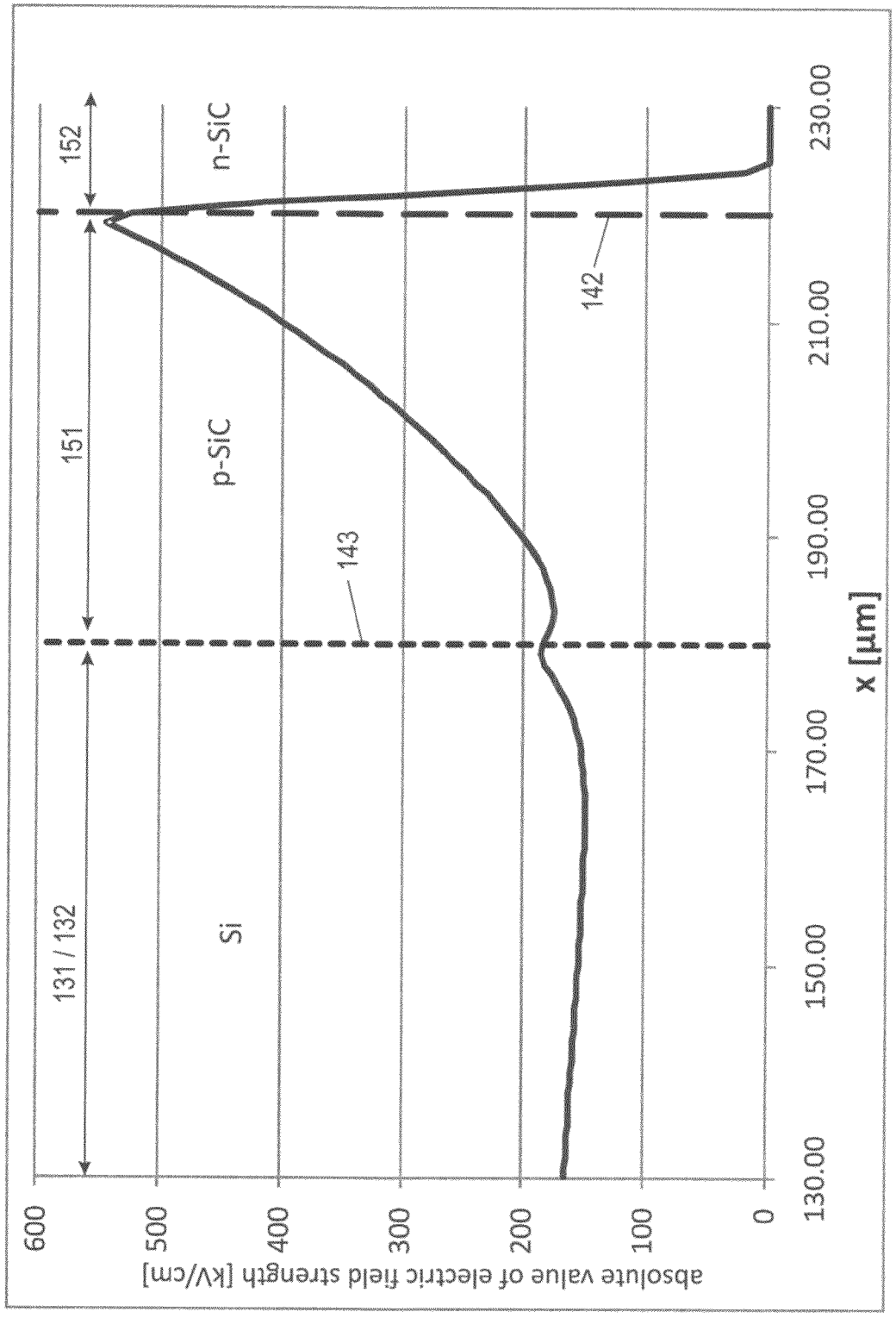
FIG. 9 illustrates the distribution of the electrical field strength along the horizontal pn-junction of the embodiment of FIG. 7.

The electric field distribution along the lateral pn-junction 141 is illustrated in FIG. 9. Indicated are also the location of the Si/p-SiC junction or third pn-junction 143 and the p-SiC/n-SiC or second (vertical) pn-junction 142. Again, the electric field in the p- and n-doped SiC regions 151, 152 significantly exceeds the electric field strength in the drift region 132 due to the much higher doping concentration of the p-doped SiC region 151.

As shown in the above Figures, a maximum field strength of about 544 kV/cm is observable close to the pn-junction 142 in the SiC material 150. However, the maximum field strength at the pn-junction 141 in the Si material 130 does not exceed the critical avalanche breakdown threshold. Such breakdown may occur in the more uncritical region of the field stop due to the shaping of the electric field. In addition to that, the lateral extension of the termination zone can be reduced to about 50 µm in comparison to 130 µm when the trench is filled with a dielectric material as commonly done. Moreover, no additional channel stopper region is needed when appropriately selecting the doping concentration and lateral thickness of the n-SiC region 152.

Figure 10:
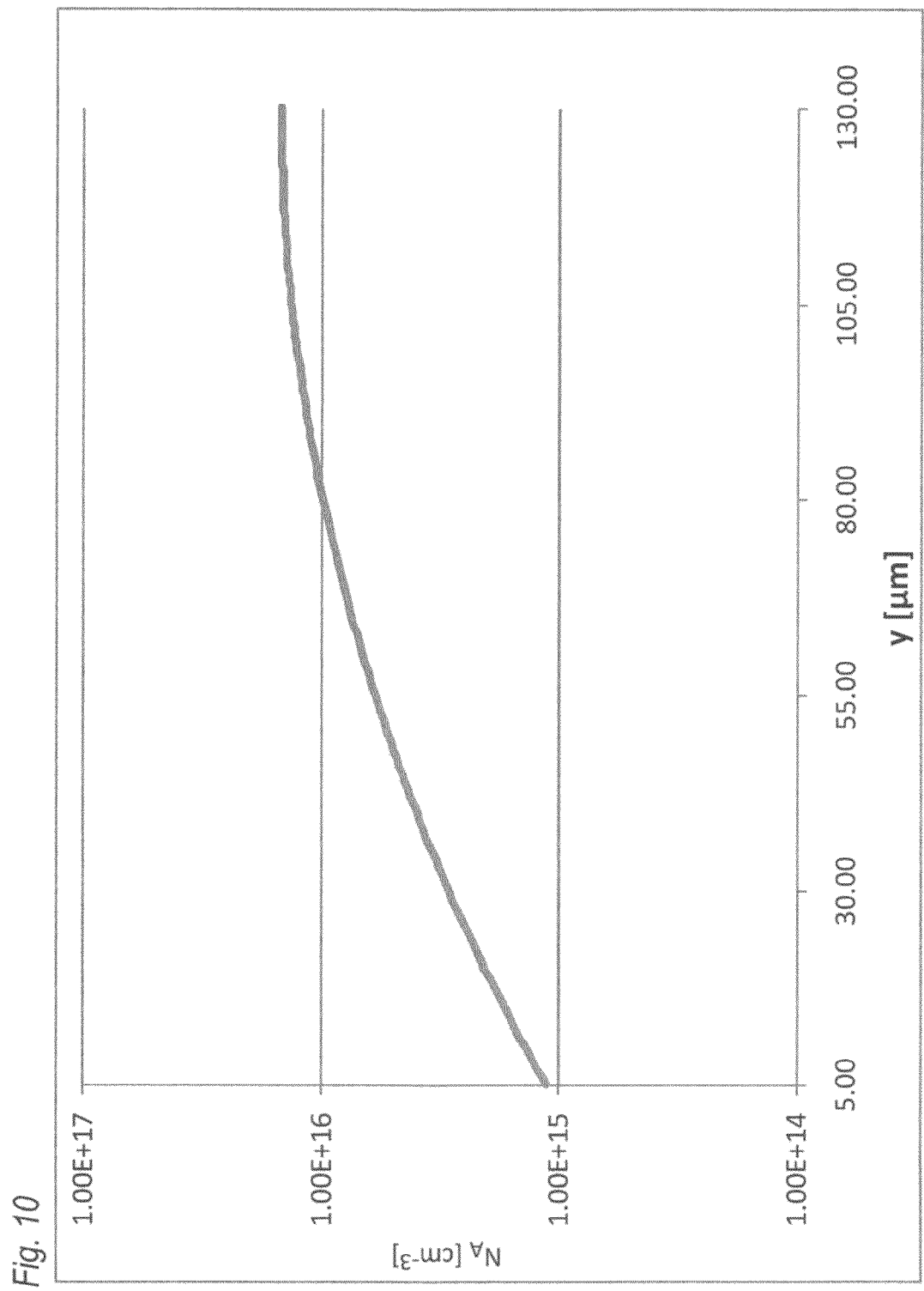
FIG. 10 illustrates the doping concentration of the first doping region of the high band-gap material in vertical direction.

According to an embodiment, the doping concentration of the first doping region (p-doped SiC region) 151 of the wide band-gap semiconductor material 150 increases towards the first surface 111. An example of such a doping gradient is illustrated in FIG. 10. The increase of the doping concentration towards the first surface 111 leads to a more even or flat electric field distribution which avoids high peak values. Moreover, a breakdown at the $nn^+$-junction between the drift region 132 and the cathode region 133 can be suppressed. As a consequence, even higher blocking voltage values can be achieved. The doping concentration of the n-doped SiC region 152 can be kept constant and has been assumed to be $2 \cdot 10^{16}/cm^3$ in the following example. The doping concentration of the p-doped SiC region 152 can increase from about $1 \cdot 10^{15}/cm^3$ at its lower end to about $2 \cdot 10^{16}/cm^3$ at its upper end.

Figure 11:
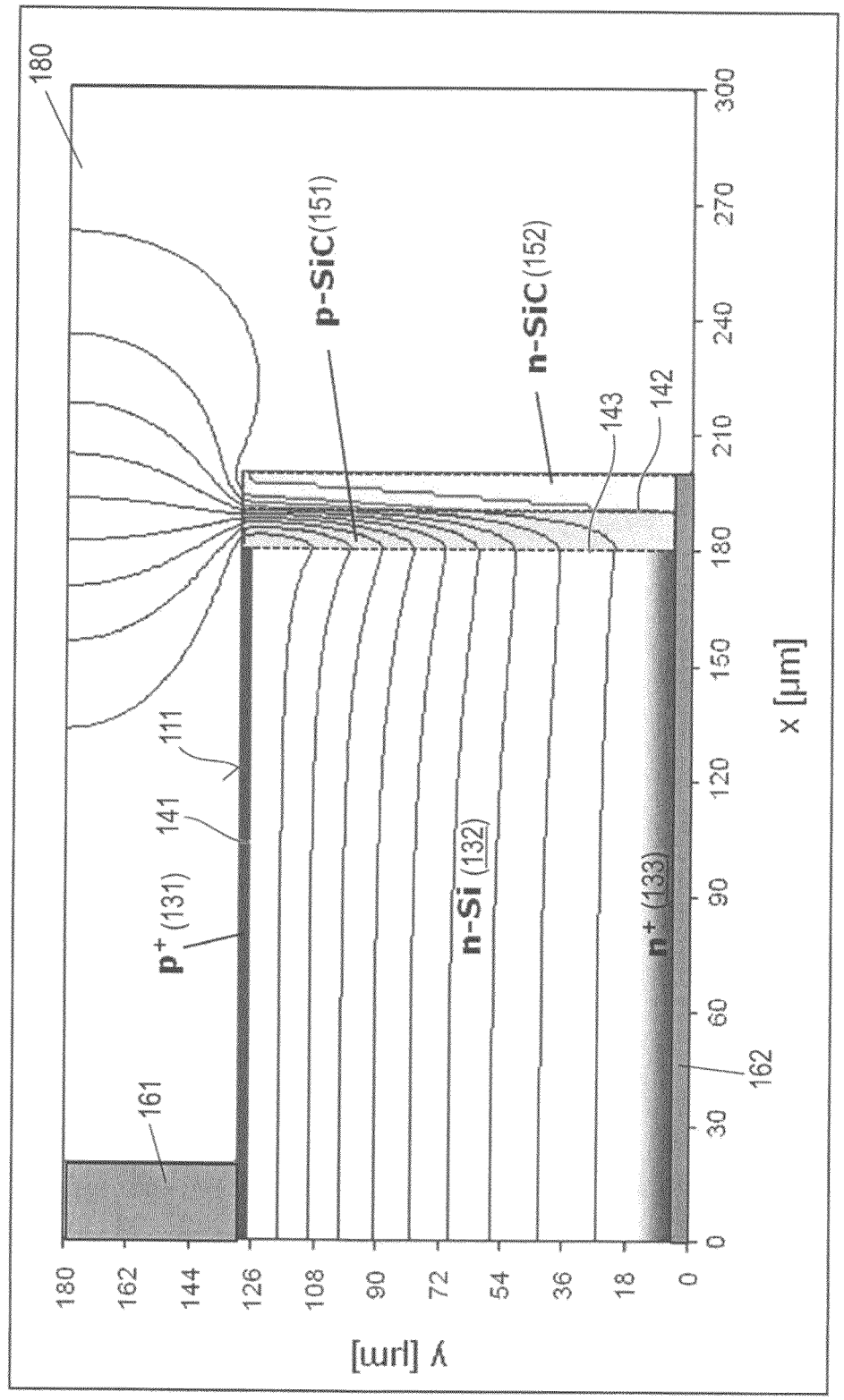
FIG. 11 illustrates a simulation of the distribution of the electric potential lines in an edge termination zone at 1800 V with the doping profile of the first doping region according to FIG. 10.
Figure 12:
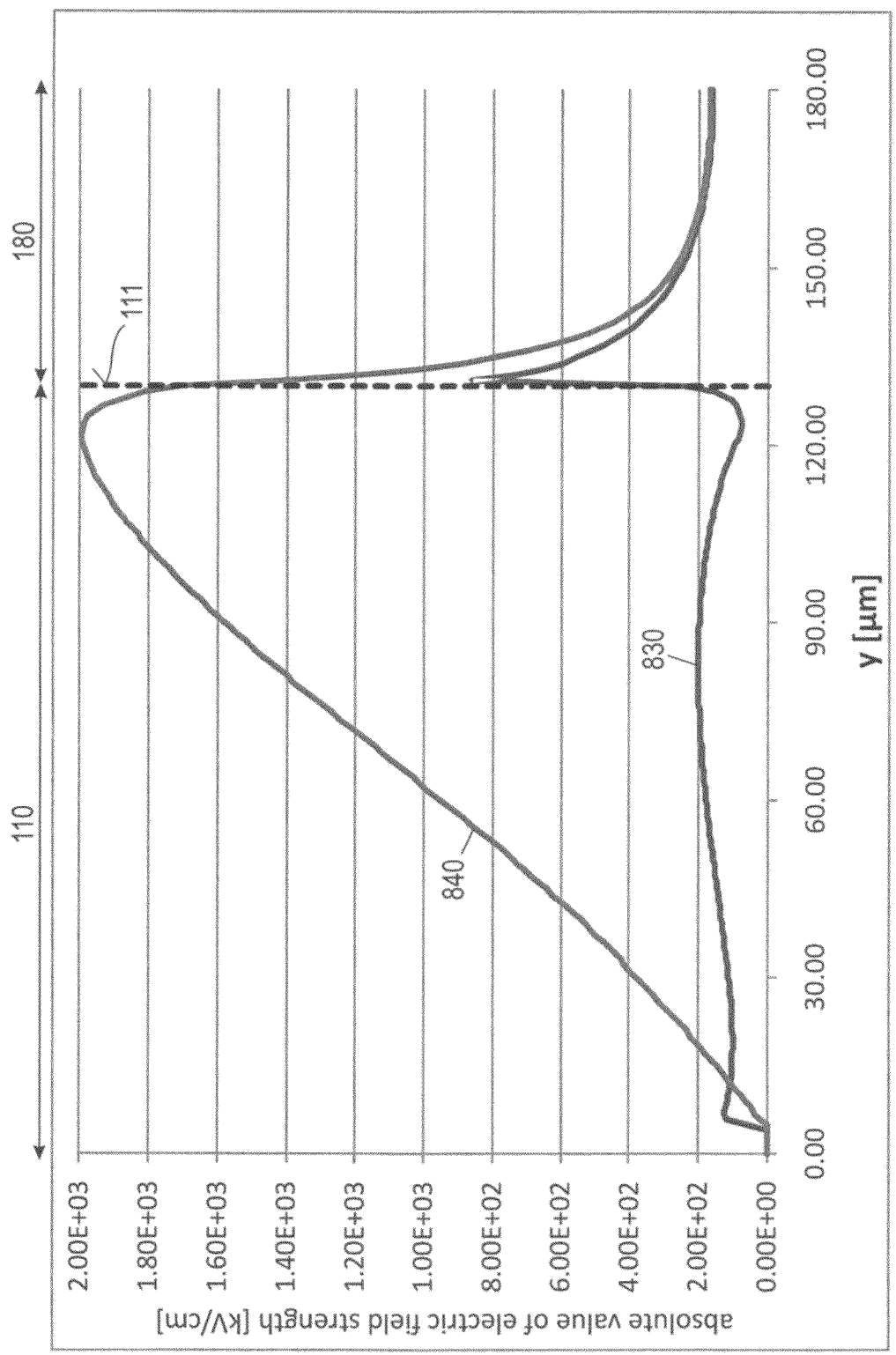
FIG. 12 illustrates the distribution of the electric field strength on the lateral edge of the Si-material and in the SiC material for the embodiment of FIG. 11.
Figure 13:
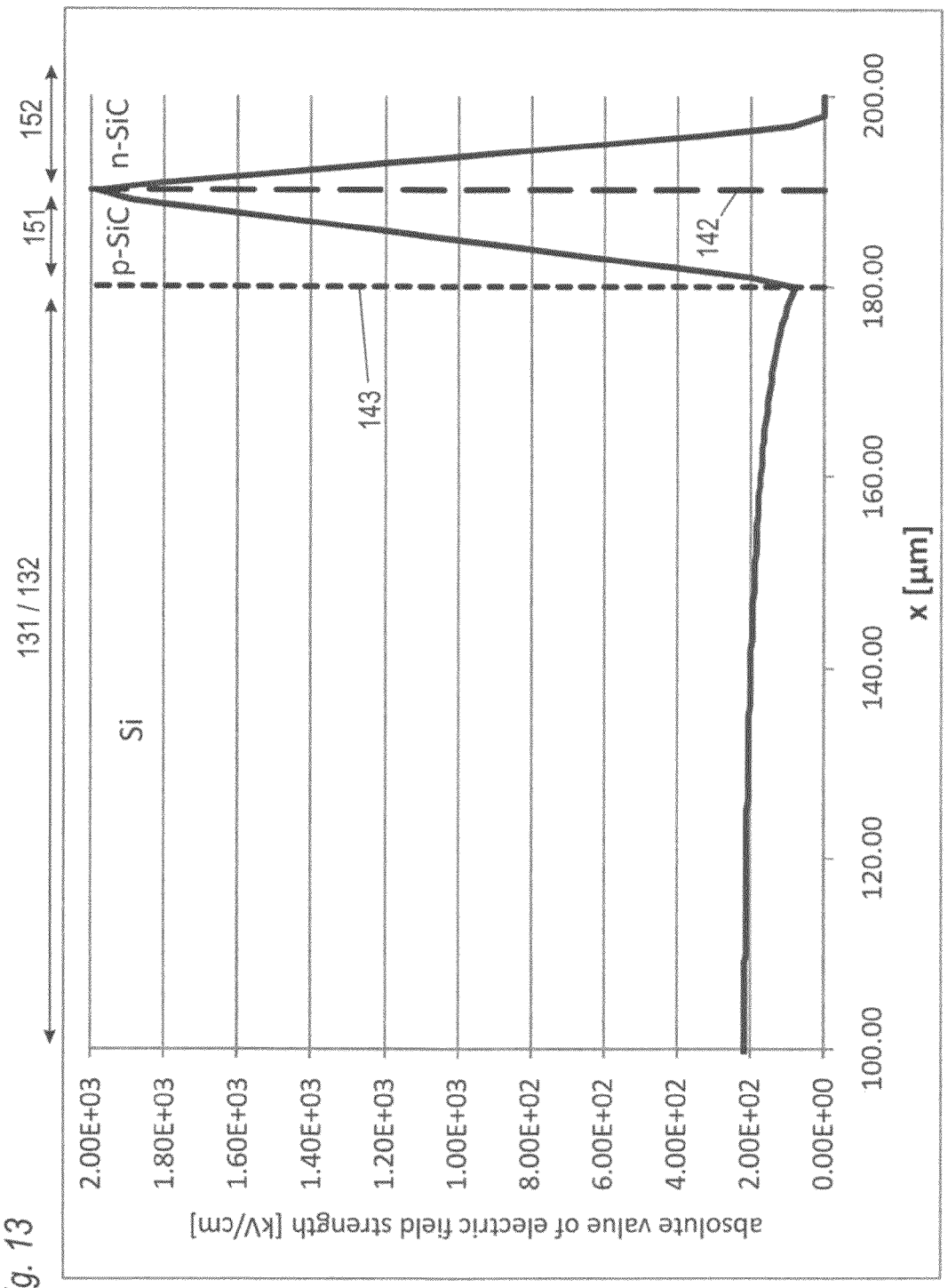
FIG. 13 illustrates the distribution of the electric field strength along the horizontal pn-junction in the Si material and through the SiC material of the embodiment of FIG. 11.

When adopting the above doping gradient for the p-doped SiC region 152, less space is needed for the edge termination zone 102 since the lateral thickness of the p-doped SiC region 152 can be significantly reduced. According to a simulation using the above values, each of the p-SiC and n-SiC regions 151, 152 only need to have a lateral thickness of about 10 µm. The resulting distribution of the corresponding electric field, as represented by its potential lines, is illustrated in FIG. 11. FIGS. 12 and 13 illustrate the electric field distribution along the lines as described in connection with FIGS. 8 and 9. The maximum electric field strength in SiC is about 2 MV/cm.

Line 830 in FIG. 12 illustrates the distribution of the electric field along the vertical Si/p-SiC interface 143, corresponding to an x-value of about 180 µm in FIG. 11, between the Si-material 130 and the p-SiC region 151 while line 840 indicates the electric field along the vertical p-SiC/n-SiC interface 142, corresponding to an x-value of about 190 µm in FIG. 11.

The electric field distribution along the lateral pn-junction 141 is illustrated in FIG. 13. The location of the Si/p-SiC junction or third pn-junction 143 and the p-SiC/n-SiC or second (vertical) pn-junction 142 is also indicated. Again, the electric field in the p- and n-doped SiC regions 151, 152 significantly exceeds the electric field strength in the drift region 132 due to the much higher doping concentration of the p-doped SiC region 151.

The semiconductor device having a vertical edge termination zone 102 with a vertical pn-junction 142 formed by a wide band-gap material can be manufactured using, for example, the following process.

A semiconductor body 110 having a first and a second surface 111, 112 is provided which includes a first semiconductor material 130 which is a low band-gap material such as Si. A first pn-junction 141 is formed in the first semiconductor material 130 by forming a first doping region 141 of a first conductivity type in the first semiconductor material 130 which includes, or is formed by, a second doping region 142 of a second conductivity type. The second doping region 142 typically corresponds to the drift region and has a doping concentration equal to the background doping of the semiconductor body 110. The first pn-junction 141 is thus formed between the first doping region (anode region) 141 and the second doping region (drift region) 142 of the first semiconductor material 130.

The first doping region 131 can be formed, for example, by maskless implantation of B-ions followed by a subsequent annealing to drive the implanted ions into the semiconductor body 110 up to the desired depth.

In a further process, a thermal oxide may be formed on the first surface 111 of the semiconductor body 110. Alternatively, a TEOS layer may be formed on the first surface 111. Using lithographic processes, the thermal oxide or the TEOS layer is structured to form a hard mask which defines the size, shape and location of a trench in a subsequent etching process. The trench may be formed in the region of the kerf or sawing frame.

In a further process, a trench, such as trench 660 is formed in the semiconductor body 110 using the above hard mask as etching mask. The trench extends from the first surface 111 of the semiconductor body 110 through the first pn-junction 141 into a given depth below the first pn-junction 141. For punch through devices, the trench can be etched deeper than the final thickness of the semiconductor body 110. The depth of the trench for non-punch through devices is typically smaller than the final thickness of the semiconductor body 110 so that, after an etch back process to thin the semiconductor body 110, the trench will not be exposed at the second surface 112 of the semiconductor body 110.

Typically, the trench is formed as a closed ring along the periphery of the device to be formed. As described in connection with FIGS. 6B and 6C, the trench can be formed in the sawing or kerf frame of the wafer along which the wafer is cut to form individual dies.

The trench is then at least partially filled with a second semiconductor material 150 having a band gap larger than the band gap of the first semiconductor material 130 to form part of an edge termination zone 102 of the semiconductor device 100. The second semiconductor material 150 can be SiC which can be epitaxially deposited. Since deposition takes place on a Si-material, the deposition is a heteroepitaxial deposition. A partial deposition can be carried out so that only the sidewalls and the bottom of the trench are covered by the SiC material leaving a central hollow space. This hollow space can be filled with a dielectric material 680 as illustrated in FIG. 6C. Alternatively, the trench 660 can be completely filled with the epitaxial SiC material 150 forming the second or wide band-gap material 150.

An optional Pt-diffusion process can be carried out to adjust the lifetime of the minority charge carriers and thus to adjust the dynamic behaviour of the final device.

In a further process, a second pn-junction 142 is formed with or within the second semiconductor material 150. The second pn-junction 142 extends deeper into the semiconductor body 110 than the first pn-junction 141 in the first semiconductor material 130. To this end, a first doping region (p-SiC) 151 of a first conductivity type can be formed in the second semiconductor material 150 so that the first doping region 151 of the second semiconductor material 150 is in electric contact with the first doping region (p-Si) 141 of the first semiconductor material 130. The first doping region 151 of the second semiconductor material 150 extends deeper into the semiconductor body 110, typically as defined by the depth of the trench, than the first doping region 131 of the first semiconductor material (Si) 130.

Moreover, a second doping region (n-SiC) 152 of the second conductivity type adjacent to and in contact with the first doping region (p-SiC) 151 of the second semiconductor material 150 is formed to form the second pn-junction 142. For example, the first doping region (p-SiC) 151 of the wide band-gap material 150 can be deposited leaving a hollow space in the trench where the second doping region (n-SiC) 152 is subsequently deposited. This allows also to form the lateral extension 253 shown in FIG. 2. The doping profile of the respective regions can be adjusted in situ during epitaxial growth.

The first doping region (p-SiC) 151 of the second semiconductor material 150 is arranged between the second doping region (n-SiC) 152 of the second semiconductor material 150 and the first and second doping regions (p-Si, n-Si) 131, 231 of the first semiconductor material 130. According to an embodiment, the first doping region 151 of the second semiconductor material 150 is doped to have a doping concentration which increases towards the first surface 111.

According to an embodiment, a first electrode 161 is formed on the first surface 111 in ohmic contact with the first doping region 141 of the first semiconductor material 130. Moreover, a passivation or dielectric 180 is formed on the first surface 111 of the semiconductor body 110. If needed, the first electrode 161 and the passivation 180 are suitably structured.

If thinning of the semiconductor body 110 is desired, the second surface 112 is polished back to the desired thickness (see second surface 612a after thinning in FIGS. 6B and 6C) which includes etching back the second surface 612 to expose bottom portions of the trench 660. In this case, the trench 660 should be completely filled to give the wafer the desired mechanical stability. If needed, a dielectric material 680 is used to completely fill the trench 660. Thinning can also be carried out without exposing the trench 660.

An optional field stop region and a cathode region 133 are formed. The field stop is typically used for punch through devices. A second electrode 162 is then deposited onto the second surface 112. The second electrode 162 is deposited to be in ohmic contact with the cathode region 133.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body comprising a first semiconductor material and further comprising a second semiconductor material that extends into the semiconductor body from an uppermost surface of the semiconductor body and that has a band gap larger than a band gap of the first semiconductor material;
a first pn-junction formed in the first semiconductor material;
at least one of a second pn-junction and a heterojunction formed by the second semiconductor material and extending deeper into the semiconductor body, with respect to the uppermost surface, than the first pn-junction, the second semiconductor material being in contact with the first semiconductor material, and forming part of an edge termination zone of the semiconductor device;
wherein
the first semiconductor material comprises at least a first doping region of a first conductivity type and at least a second doping region of a second conductivity type,
the first and second doping regions form the first pn-junction in the first semiconductor material,
the first doping region is in ohmic contact with a first electrode arranged on the uppermost surface of the semiconductor body, and
the second semiconductor material comprises at least a first doping region of the first conductivity type adjacent to and in contact with each of the first and second doping regions of the first semiconductor material.

2. The semiconductor device of claim 1, wherein the first doping region of the second semiconductor material extends deeper into the semiconductor body than the first doping region of the first semiconductor material.

3. The semiconductor device of claim 1, wherein the second semiconductor material comprises at least a second doping region of a second conductivity type in contact with the first doping region of the second semiconductor material, wherein the second pn-junction of the second semiconductor material is formed between the first and second doping regions of the second semiconductor material.

4. The semiconductor device of claim 3, wherein the first doping region of the second semiconductor material is arranged between the second doping region of the second semiconductor material and the first and second doping regions of the first semiconductor material.

5. The semiconductor device of claim 3, wherein the first and second doping regions of the second semiconductor material extend from the uppermost surface to a second surface of the semiconductor body arranged opposite the uppermost surface.

6. The semiconductor device of claim 3, wherein the first and second doping regions of the second semiconductor material extend from the uppermost surface only partially into the semiconductor body up to a given depth.

7. The semiconductor device of claim 1, wherein the first doping region of the second semiconductor material extends from the uppermost surface only partially into the semiconductor body up to a given depth.

8. The semiconductor device of claim 1, wherein the first doping region of the second semiconductor material extends from the uppermost surface to a second surface of the semiconductor body arranged opposite the uppermost surface.

9. The semiconductor device of claim 1, further comprising a second electrode on a second surface of the semiconductor body arranged opposite the uppermost surface, wherein the second electrode is in ohmic contact with the second doping region of the first semiconductor material.

10. The semiconductor device of claim 1, further comprising:
a third doping region of the first conductivity type formed in the first semiconductor material; and
a second electrode on a second surface of the semiconductor body arranged opposite the uppermost surface, wherein the second electrode is in ohmic contact with the third doping region of the first semiconductor material.

11. The semiconductor device of claim 1, wherein a doping concentration of the first doping region of the second semiconductor material increases towards the uppermost surface.

12. The semiconductor device of claim 1, wherein the first semiconductor material is Si and the second semiconductor material is SiC.

13. The semiconductor device of claim 1, wherein the second semiconductor material laterally surrounds the first semiconductor material at least on a first surface of the semiconductor body to form the edge termination zone surrounding an active area of the semiconductor device.

14. A semiconductor device, comprising:
a semiconductor body;
a first semiconductor material formed in the semiconductor body and comprising at least a first doping region of a first conductivity type and at least a second doping region of a second conductivity type arranged below the first doping region with respect to an uppermost surface of the semiconductor body, the first and second doping regions forming a horizontal pn-junction in the first semiconductor material which is substantially parallel to the uppermost surface of the semiconductor body; and
a second semiconductor material formed in the semiconductor body, having a band gap larger than a band gap of the first semiconductor material, and comprising at least a first doping region of the first conductivity type adjacent to and in contact with each of the first and second doping regions of the first semiconductor material, the first doping region of the second semiconductor material extending deeper into the semiconductor body, with respect to the uppermost surface of the semiconductor body, than the first doping region of the first semiconductor material.

15. The semiconductor device of claim 14, wherein the second semiconductor material comprises at least a second doping region of a second conductivity type in contact with the first doping region of the second semiconductor material and forming a substantially vertical pn-junction in the second semiconductor material which extends deeper into the semiconductor body than the horizontal pn-junction in the first semiconductor material.

16. The semiconductor device of claim 14, wherein
the first doping region of the first semiconductor material is in ohmic contact with a first electrode arranged on the first surface of the semiconductor body, and
the first doping region of the second semiconductor material is in ohmic contact with a second electrode formed on a second surface of the semiconductor body arranged opposite the first surface.

17. A semiconductor device, comprising:
a semiconductor body;
a silicon semiconductor material formed in the semiconductor body and comprising at least a first doping region of a first conductivity type and at least a second doping region of a second conductivity type in contact with the first doping region and arranged below the first doping region with respect to an uppermost surface of the semiconductor body;
a horizontal pn-junction in the silicon semiconductor material formed between the first and second doping regions of the silicon semiconductor material;
a high band-gap semiconductor material formed in the semiconductor body and comprising a first doping region of the first conductivity type adjacent to and in contact with each of the first and second doping regions of the silicon semiconductor material, and a second doping region of the second conductivity type in contact with the first doping region of the high band-gap semiconductor material; and
a substantially vertical pn-junction in the high band-gap semiconductor material formed between the first and second doping regions of the high band-gap semiconductor material, the vertical pn-junction extending deeper into the semiconductor body, with respect to the uppermost surface of the semiconductor body, than the horizontal pn- junction.

18. A method for manufacturing a semiconductor device, comprising:
providing a semiconductor body comprising a first semiconductor material having a second doping region of a second conductivity type;
forming a first doping region of a first conductivity type in the first semiconductor material to form a first pn-junction between the first doping region and the second doping region of the first semiconductor material;
forming a trench in the semiconductor body extending from an uppermost surface of the semiconductor body through the first pn-junction to a depth below the first pn-junction;
filling the trench at least partially with a second semiconductor material having a band gap larger than a band gap of the first semiconductor material, by heteroepitaxial deposition of the second semiconductor material onto the first semiconductor material, to form part of an edge termination zone of the semiconductor device;
and forming a second pn-junction with the second semiconductor material such that the second pn-junction extends deeper into the semiconductor body than the first pn-junction in the first semiconductor material, by forming a first doping region of the first conductivity type in the second semiconductor material so that the first doping region of the second semiconductor material is in contact with the first doping region of the first semiconductor material, wherein the first doping region of the second semiconductor material extends deeper into the semiconductor body than the first doping region of the first semiconductor material.

19. The method of claim 18, further comprising: forming a first electrode on the uppermost surface in ohmic contact with the first doping region of the first semiconductor material.

20. The method of claim 18, further comprising:
forming a second doping region of a second conductivity type in the second semiconductor material and in contact with the first doping region of the second semiconductor material to form the second pn-junction, so that the first doping region of the second semiconductor material is arranged between the second doping region of the second semiconductor material and the first and second doping regions of the first semiconductor material.

21. The method of claim 18, wherein the first doping region of the second semiconductor material has a doping concentration which increases towards the uppermost surface.

* * * * *